(12) United States Patent
Nayak et al.

(10) Patent No.: US 10,892,083 B1
(45) Date of Patent: Jan. 12, 2021

(54) THERMAL MANAGEMENT OF TOROIDAL TRANSFORMER MOUNTED ON A PRINTED WIRING BOARD STIFFENER

(71) Applicant: Hamilton Sundstrand Corporation, Charlotte, NC (US)

(72) Inventors: Hebri Vijayendra Nayak, Rockford, IL (US); Scott C. Wohlfarth, Edgerton, WI (US); Michael Anthony Futrell, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/911,607

(22) Filed: Jun. 25, 2020

(51) Int. Cl.
| | | |
|---|---|---|
| *H01F 27/06* | (2006.01) | |
| *H01F 27/24* | (2006.01) | |
| *H05K 1/18* | (2006.01) | |
| *H01F 27/32* | (2006.01) | |
| *H01F 27/08* | (2006.01) | |

(52) U.S. Cl.
CPC .............. *H01F 27/24* (2013.01); *H01F 27/06* (2013.01); *H01F 27/085* (2013.01); *H01F 27/327* (2013.01); *H05K 1/181* (2013.01); *H05K 2201/1003* (2013.01)

(58) Field of Classification Search
CPC ......... H01F 27/06; H01F 27/24; H01F 27/327
See application file for complete search history.

(56) References Cited

U.S. PATENT DOCUMENTS

| | | | |
|---|---|---|---|
| 6,879,237 B1* | 4/2005 | Viarouge | H01F 17/043 336/212 |
| 7,375,611 B1* | 5/2008 | Pleskach | H01F 27/2804 336/229 |
| 8,836,459 B1* | 9/2014 | Hsu | H01F 27/06 336/65 |
| 9,066,453 B2 | 6/2015 | Wagner et al. | |
| 9,496,213 B2 | 11/2016 | Kidwell, Jr. et al. | |
| 2010/0127637 A1* | 5/2010 | Alexander | F21V 17/14 315/294 |
| 2012/0098509 A1* | 4/2012 | de Rochemont | H01F 27/2804 323/282 |
| 2015/0096168 A1* | 4/2015 | Itoh | H01F 41/10 29/605 |
| 2015/0371750 A1* | 12/2015 | Cheng | H01F 27/292 336/90 |
| 2017/0316863 A1 | 11/2017 | Francis | |
| 2018/0315706 A1 | 11/2018 | Liao et al. | |

* cited by examiner

*Primary Examiner* — Sherman Ng
(74) *Attorney, Agent, or Firm* — Cantor Colburn LLP (57) ABSTRACT

A toroidal transformer assembly of an electronic component module assembly includes a transformer mounting plate receptive of the toroidal transformer. The transformer mounting plate includes a base, a center boss extending from the base, and an outer ring extending from the base, and spaced apart from the center boss. The center boss and the outer ring define a mounting location for a toroidal transformer therebetween. A plurality of fins are positioned to conduct thermal energy from the toroidal transformer to the base.

20 Claims, 11 Drawing Sheets

THERMAL MANAGEMENT OF TOROIDAL TRANSFORMER MOUNTED ON A PRINTED WIRING BOARD STIFFENER

BACKGROUND

Exemplary embodiments pertain to the art of electrical power systems, and in particular to assembly, disassembly and cooling of such electrical power systems.

Electrical power systems include, for example, one or more toroidal transformers as part of a printed wiring board (PWB) assembly. A toroidal transformer is a package including a toroidal-shaped magnetic core with a conductive winding around the core.

The nature of the toroid shape, while efficient at keeping magnetic flux confined, presents a challenge to remove heat dissipated in the core and windings. Traditionally, the wound assembly is placed in contact with a chassis or heatsink, which only provides thermal contact in a circle with little surface area for conduction. To prevent damage to the winding(s), they need to be sized to accommodate the worst case "hot spot" temperature, increasing the size and weight of the assembly.

As such electrical power systems, such as electrical power systems for space applications, become increasingly power dense, there is a need for solutions to adequately cool the components of the electrical power system. Further, it is desired to improve modularity of such systems, thereby making the systems easier to assemble and easier to disassemble or replace components.

BRIEF DESCRIPTION

In one embodiment, a toroidal transformer assembly of an electronic component module assembly includes a transformer mounting plate receptive of the toroidal transformer. The transformer mounting plate includes a base, a center boss extending from the base, and an outer ring extending from the base, and spaced apart from the center boss. The center boss and the outer ring define a mounting location for a toroidal transformer therebetween. A plurality of fins are positioned to conduct thermal energy from the toroidal transformer to the base.

Additionally or alternatively, in this or other embodiments a volume of potting material is positioned in the mounting location, between the center boss and the outer ring.

Additionally or alternatively, in this or other embodiments the volume of potting material substantially covers the toroidal transformer.

Additionally or alternatively, in this or other embodiments a plurality of center fins extend radially outwardly from the center boss; and a plurality of inner fins extend radially inwardly from the outer ring.

Additionally or alternatively, in this or other embodiments the toroidal transformer includes a toroidal core, and one or more conductive windings wrapped around the core.

Additionally or alternatively, in this or other embodiments a plurality of outer fins extend radially outwardly from the outer ring.

In another embodiment, an electrical component module assembly includes a printed wiring board, a first stiffener affixed to the printed wiring board, and a toroidal transformer assembly secured to the first stiffener. The toroidal transformer includes a toroidal transformer, including a toroidal core and one or more conductive windings wrapped around the core. A transformer mounting plate is receptive of the toroidal transformer. The transformer mounting plate includes a base, a center boss extending from the base, and an outer ring extending from the base, and spaced apart from the center boss, the center boss and the outer ring defining a mounting location for the toroidal transformer therebetween. A plurality of fins are positioned to conduct thermal energy from the toroidal transformer to the base, and into the first stiffener.

Additionally or alternatively, in this or other embodiments a volume of potting material is positioned in the mounting location, between the center boss and the outer ring.

Additionally or alternatively, in this or other embodiments the volume of potting material substantially covers the toroidal transformer.

Additionally or alternatively, in this or other embodiments a plurality of center fins extend radially outwardly from the center boss.

Additionally or alternatively, in this or other embodiments a plurality of inner fins extend radially inwardly from the outer ring.

Additionally or alternatively, in this or other embodiments a plurality of outer fins extend radially outwardly from the outer ring.

Additionally or alternatively, in this or other embodiments the thermal energy is conducted into wedge lock mounting rail of the first stiffener.

Additionally or alternatively, in this or other embodiments an electromagnetic interference gasket is located between the transformer mounting plate and the first stiffener.

Additionally or alternatively, in this or other embodiments a second stiffener is assembled to the first stiffener.

Additionally or alternatively, in this or other embodiments a second printed wiring board is secured to the second stiffener opposite the first stiffener.

Additionally or alternatively, in this or other embodiments an electromagnetic interference shield layer is secured to the second stiffener over the toroidal transformer.

Additionally or alternatively, in this or other embodiments a stiffener ring extends from the second stiffener toward the transformer mounting plate and is configured to locate the second stiffener relative to the toroidal transformer assembly.

Additionally or alternatively, in this or other embodiments one or more wedge locks secure the toroidal transformer assembly to the first stiffener.

Additionally or alternatively, in this or other embodiments the printed wiring board is permanently bonded to the first stiffener.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
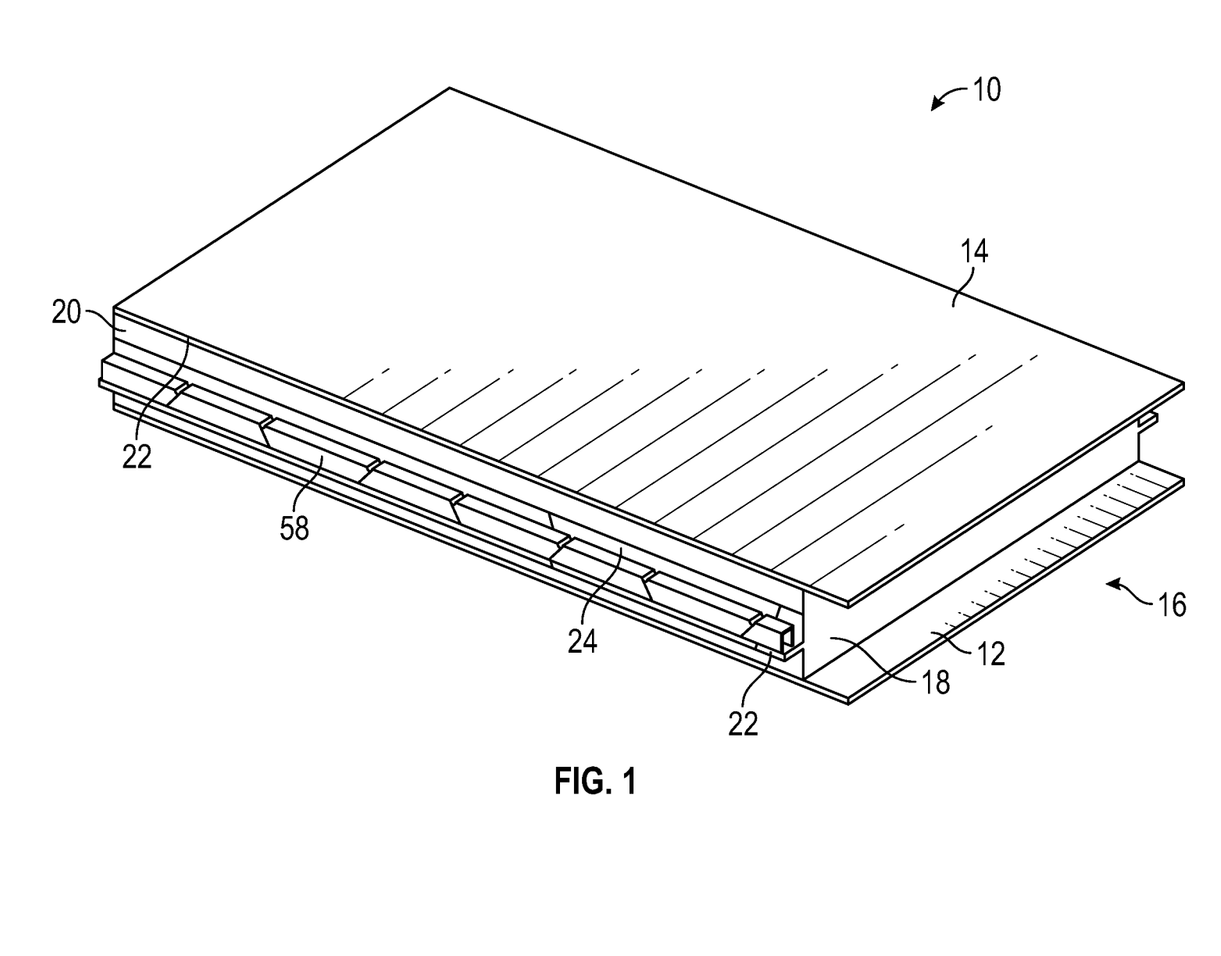
FIG. 1 is a perspective view of an embodiment of an electronic component assembly module.

Referring now to FIG. 1, shown is a perspective view of an electronic component assembly module 10. The assembly module 10 includes a first printed wiring board (PWB) 12 and a second PWB 14 disposed at opposing sides of a stiffener assembly 16, which is located between the first PWB 12 and the second PWB 14 and secured thereto. The stiffener assembly 16 includes a first stiffener 18 secured to the first PWB 12, and a second stiffener 20 secured to the second PWB 14. The first stiffener 18 and the second stiffener 20 are formed from highly thermally conductive materials, such as aluminum or copper. In some embodiments, the connection between each PWB 12, 14 and the respective stiffener 18, 20 is a permanent bonded connection via, for example, a layer of two-sided adhesive film 22 between each PWB 12, 14 and respective stiffener 18, 20. The stiffener assembly 16 further includes a transformer unit 24 disposed between the first stiffener 18 and the second stiffener 20. The stiffener assembly 16 of the first stiffener 18, the second stiffener 20 and the transformer unit 24, along with the first PWB 12 and the second PWB 14 are secured as an assembly module 10 via one or more wedge locks 58.

Figure 2:
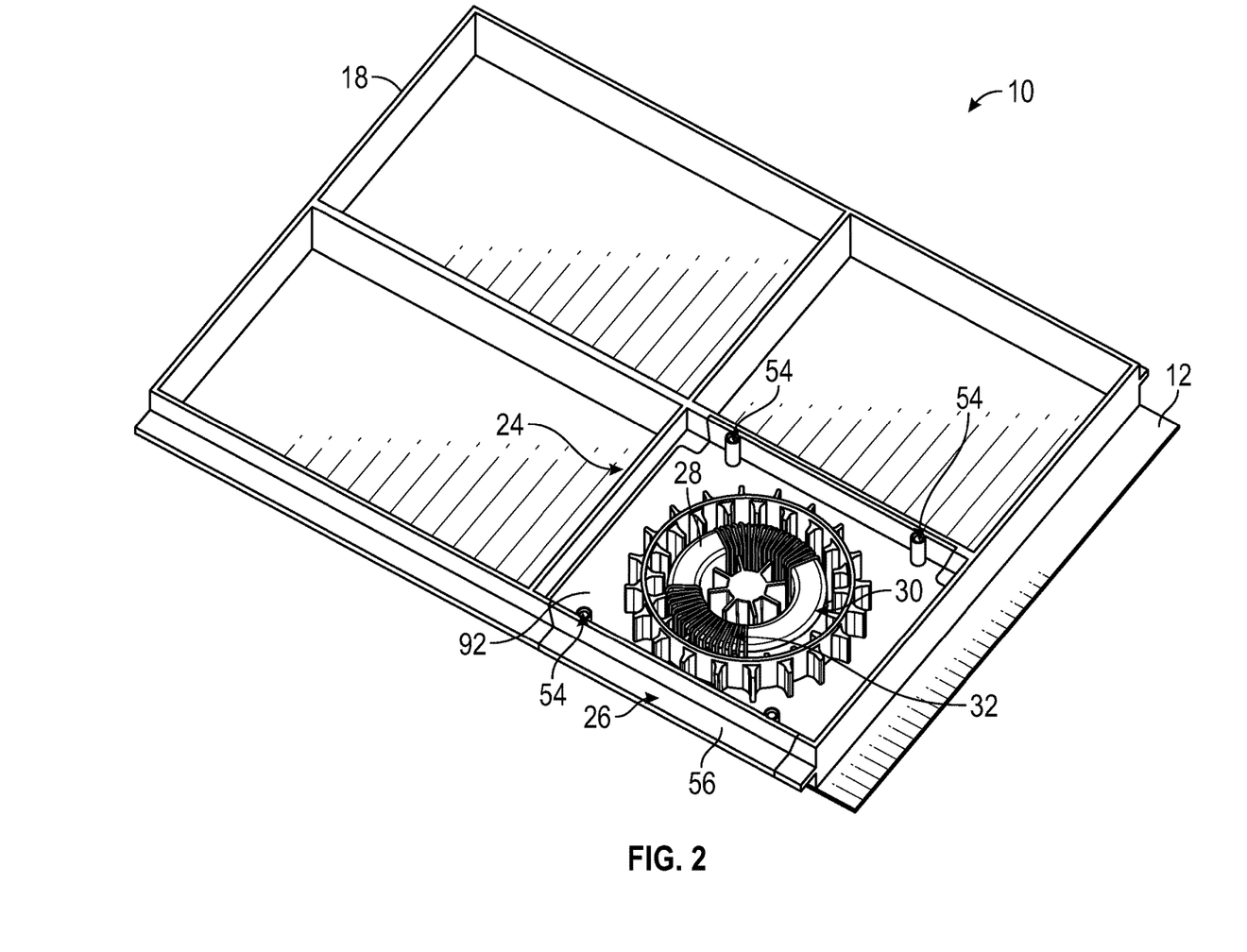
FIG. 2 is a perspective view of a partially disassembled electronic component assembly module.

Referring to FIG. 2, illustrated is a perspective view of a partially-disassembled assembly module 10, having the second PWB 14 and the second stiffener 20 removed. The transformer unit 24 includes a transformer mounting plate 26 and a toroidal transformer 28 disposed in the transformer mounting plate 26. The toroidal transformer 28 includes a toroidally-shaped magnetic core 30 with one or more electrically conductive windings 32 wrapped around the core 30. In some embodiments, the toroidal transformer 28 includes one winding 32, while other embodiments may include two or more windings 32. The windings 32 are formed from a highly-electrically conductive material, such as a copper material, while in some embodiments the core 30 is formed from a ferrite material.

Figure 3:
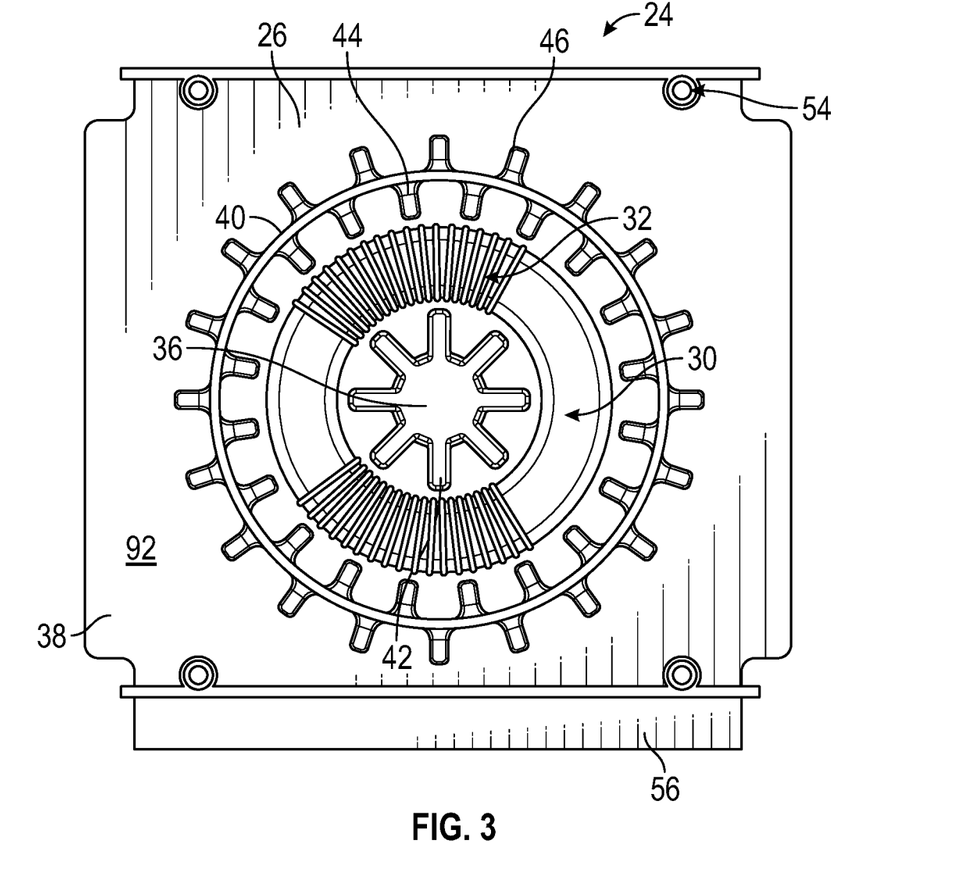
FIG. 3 is a plan view of an embodiment of a toroidal transformer assembly.
Figure 4:
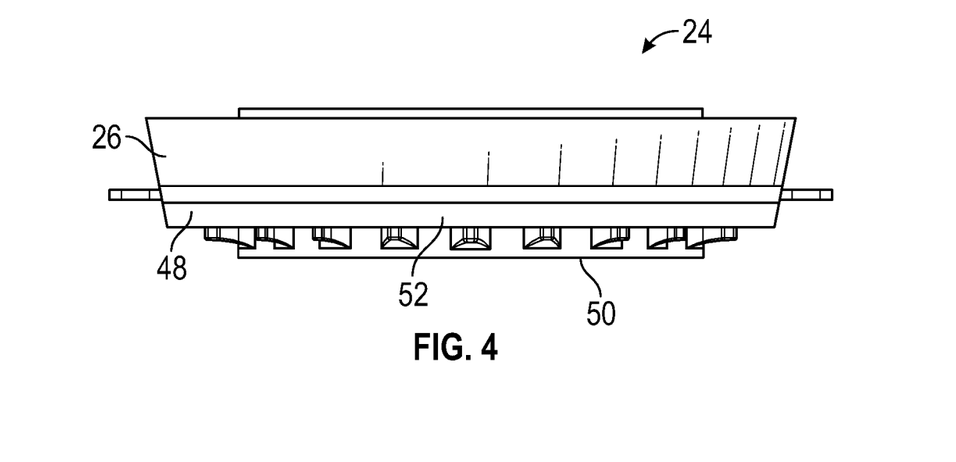
FIG. 4 is a side view of an embodiment of a toroidal transformer assembly.
Figure 5:
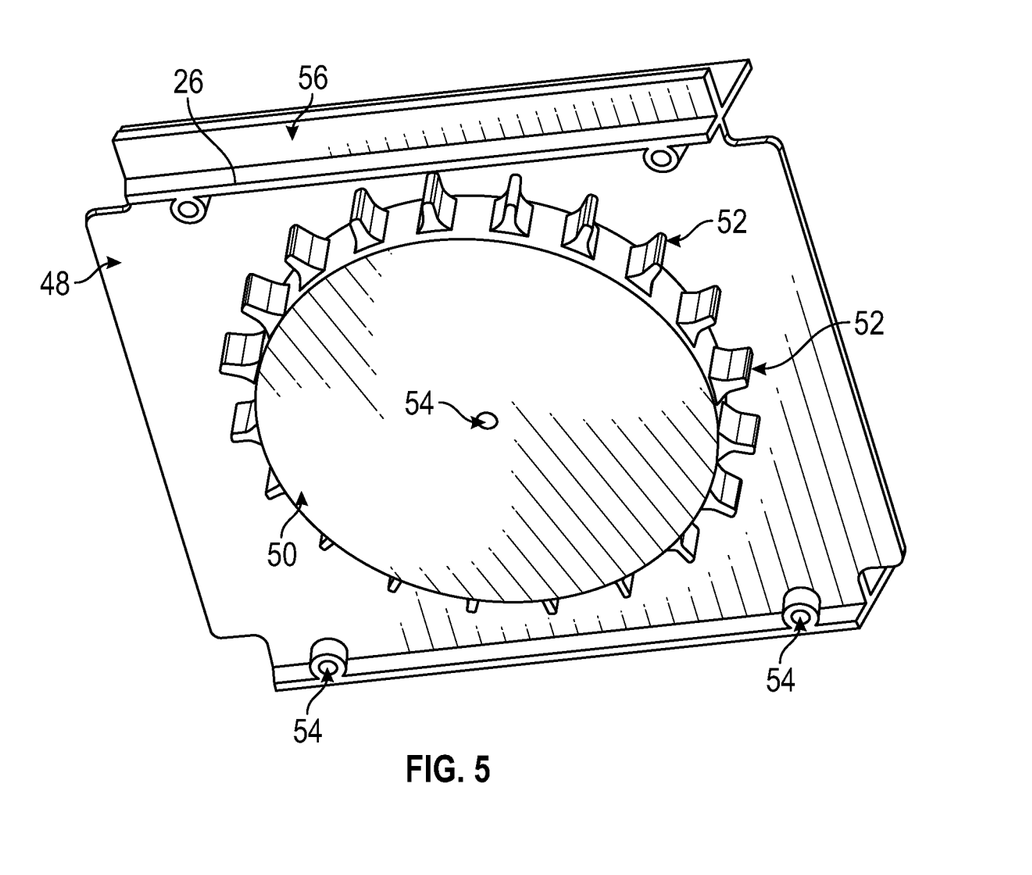
FIG. 5 is a perspective view of an embodiment of a toroidal transformer assembly.

With reference now to FIGS. 3-5, the toroidal transformer 28 and the transformer mounting plate 26 will now be described in more detail. The transformer mounting plate 26 is formed from a thermally conductive material such as copper or aluminum, and includes a mounting location for the toroidal transformer 28 defined by a center boss 36 extending from a first side 38 of a base 92 of the mounting plate 26, and an outer ring 40 extending from the first side 38. Upon assembly, the toroidal transformer 28 is located between the center boss 36 and the outer ring 40. A plurality of center fins 42 extend radially outwardly from the center boss 36 toward the toroidal transformer 28. At the outer ring 40, a plurality of inner fins 44 extend radially inwardly from the outer ring 40 toward the toroidal transformer 28, and a plurality of outer fins 46 extend radially outwardly from the outer ring 40. Further, at a second side 48 of the transformer mounting plate 26 opposite the first side 38, a mounting base plate 50 protrudes from the second side 48. In some embodiments, the mounting base plate 50 has a circular shape, but in other embodiments other shapes may be utilized. A plurality of lower fins 52 are located at the second side 48 and extend radially outwardly from the mounting base plate 50.

The transformer mounting plate 26 further includes mounting provisions for securing the transformer unit 24 to the first stiffener 18. In the embodiment shown, the mounting provisions include fastener holes 54 through which fasteners (not shown) extend to secure the transformer unit 24 to the first stiffener 18. Further, the transformer mounting plate 26 includes a plate rail 56 to which the wedge locks 58 are installed.

Figure 6:
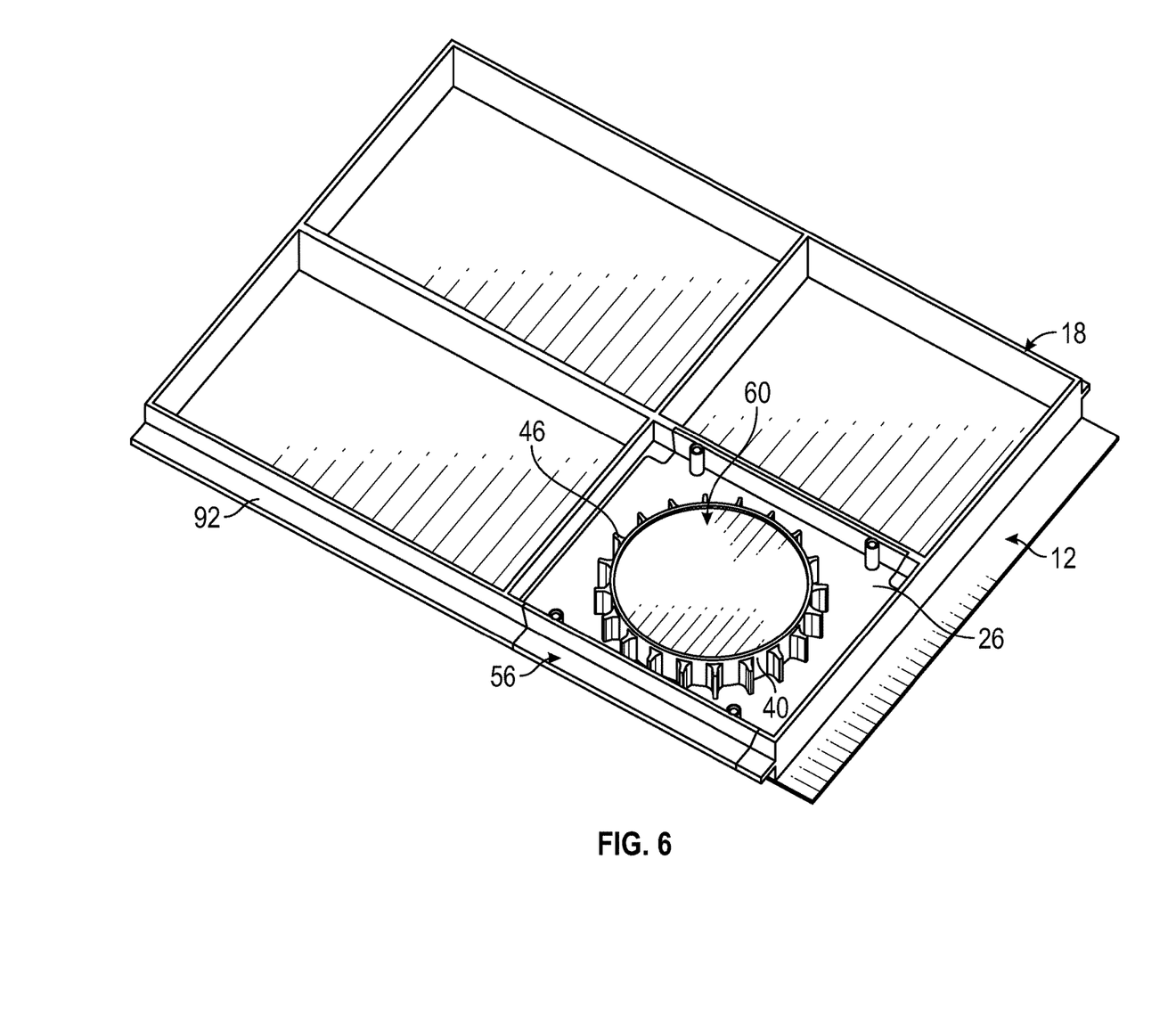
FIG. 6 is a partial perspective view of an embodiment of an electronic component assembly module.
Figure 7:
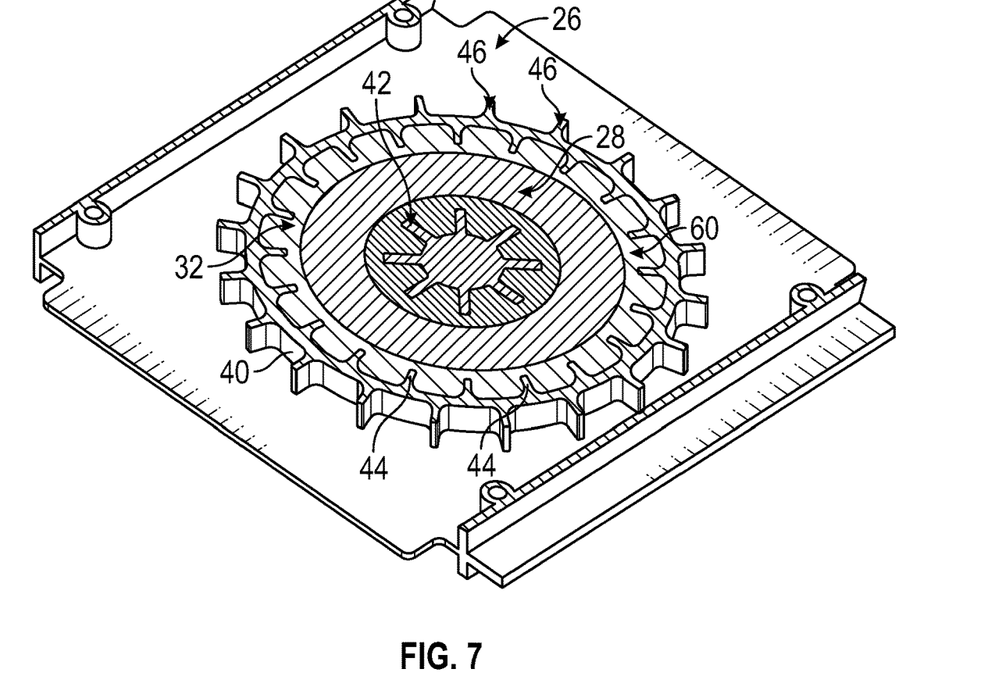
FIG. 7 is a cross-sectional view of an embodiment of a toroidal transformer assembly.

Referring now to FIG. 6, once the toroidal transformer 28 is installed to the transformer mounting plate 26, a volume of potting material 60 is added to the volume inside the outer ring 40 of the transformer mounting plate 26 in which the toroidal transformer 28 is installed. In some embodiments, such as shown, the potting material 60 substantially covers the toroidal transformer 28. In some embodiments, the potting material 60 is and encapsulant commercially available as Stycast 2850, Sylgard 170, or Scotchcast 280. As shown in the cross-sectional view of FIG. 7, the potting material 60 fills spaces between adjacent inner fins 44, between the outer ring 40 and the toroidal transformer 28, between adjacent center fins 42, and between the center boss 36 and the toroidal transformer 28.

Figure 8:
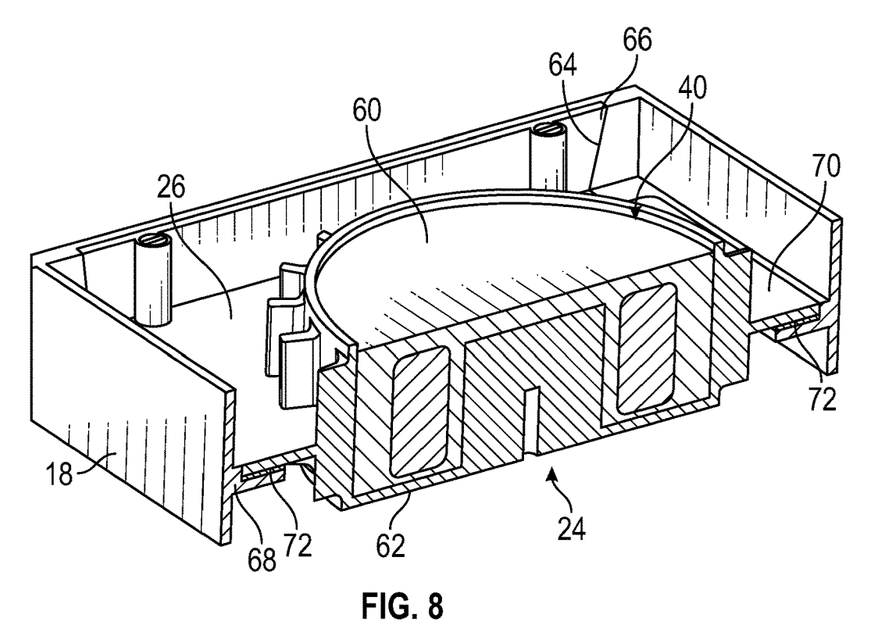
FIG. 8 is another cross-sectional view of an embodiment of a toroidal transformer assembly.

Referring now to FIG. 8, a cross-sectional view is shown of the transformer unit 24 installed into a transformer opening 62 in the first stiffener 18. The transformer mounting plate 26 includes a tapered plate end 64 installed at a complimentary tapered opening end 66 in the transformer opening 62 to locate the transformer unit 24 in the first stiffener 18. Further, the first stiffener 18 includes a stiffener flange 68 at which a plate flange 70 of the transformer mounting plate 26 is located. In some embodiments an electromagnetic interference (EMI) gasket 72 is located between the stiffener flange 68 and the plate flange 70. The EMI gasket 72 is formed from, for example, a wire mesh, and provides a low impedance path between the transformer mounting plate 26 and the first stiffener 18, and also facilitates an electrical bond between dissimilar metals.

Figure 9:
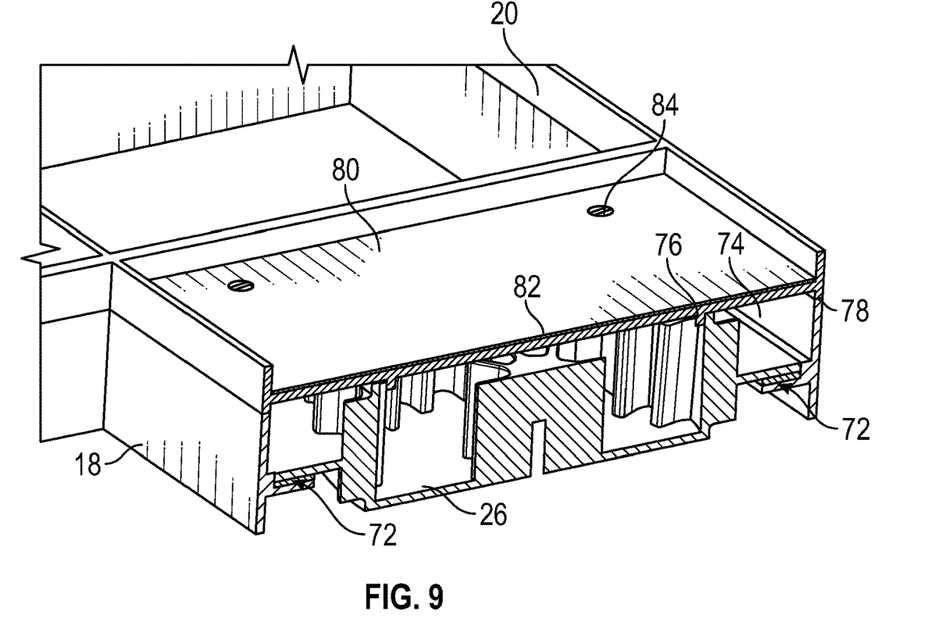
FIG. 9 is a partial cross-sectional view of an embodiment of an electronic component assembly module.

Referring now to FIG. 9, a cross-sectional view is shown of the second stiffener 20 installed over the transformer unit 24/first stiffener 18 assembly. The second stiffener 20 includes a stiffener plate 74 located at the transformer unit 24. A stiffener ring 76 is located at a first side 78 of the stiffener plate 74 and extends toward the transformer unit 24. The stiffener ring 76 is sized to interface with the outer ring 40 of the transformer mounting plate 26 to locate the second stiffener 20 relative to the transformer mounting plate 26. In some embodiments, such as shown in FIG. 9, the diameter of the stiffener ring 76 is smaller than the diameter of the outer ring 40. Locating the second stiffener 20 via the interface between the stiffener ring 76 and the outer ring 40 further increases shock and vibration tolerance of the assembly. Further, in some embodiments, an EMI shield layer 80 is secured to a second side 82 of the stiffener plate 74, opposite the first side 78. The EMI shield layer 80 is formed form a thin metal material that has high eddy current losses in the presence of radio frequencies, or in other words is highly absorbent of radio frequencies. The EMI shield layer 80 thus reduces a magnetic field induced in the second PWB 14. The EMI shield layer 80 is secured to the second side 82 by, for example, a plurality of fasteners 84 extending through the EMI shield layer 80 and into the second stiffener 20.

Figure 10:
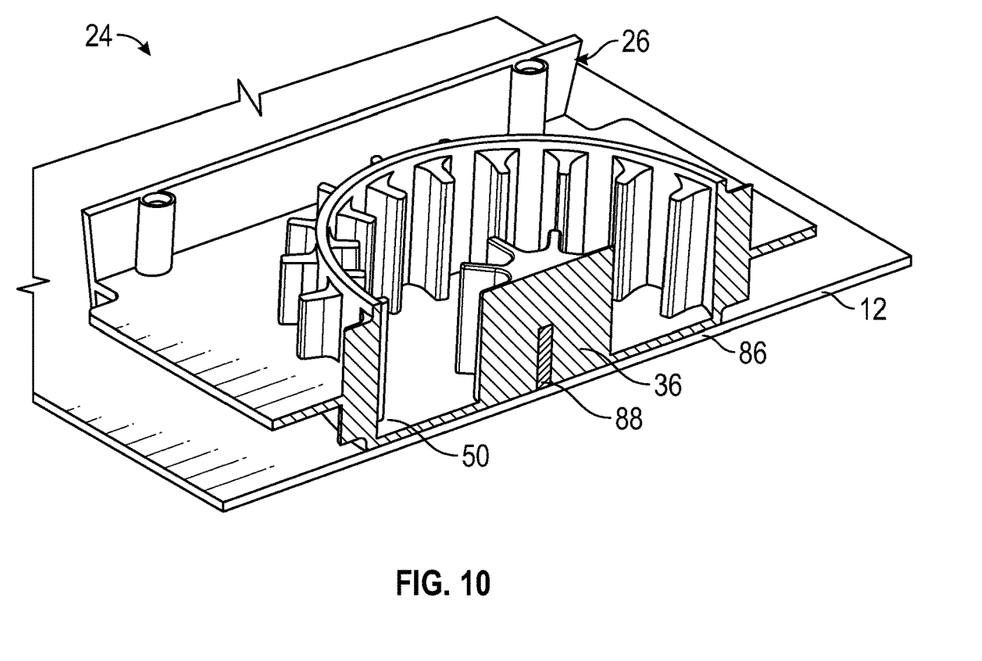
FIG. 10 is a cross-sectional view of an embodiment of a transformer mounting plate.

Referring now to FIG. 10, a cross-sectional view of an interface between the first PWB 12 and the transformer unit 24 is illustrated. The first stiffener 18 has been removed for clarity. A layer of thermal interface material 86 is positioned between the first PWB 12 and the mounting base plate 50 of the transformer mounting plate 26. The thermal interface material 86 helps in reducing the interface thermal resistance between the two components. This is turn aids in removing more heat from the toroidal transformer 28. A fastener 88 extends from the first PWB 12 into the transformer mounting plate 26, for example, into the center boss 36 to secure the first PWB 12 to the transformer unit 24 with the thermal interface material 86 therebetween.

Figure 11:
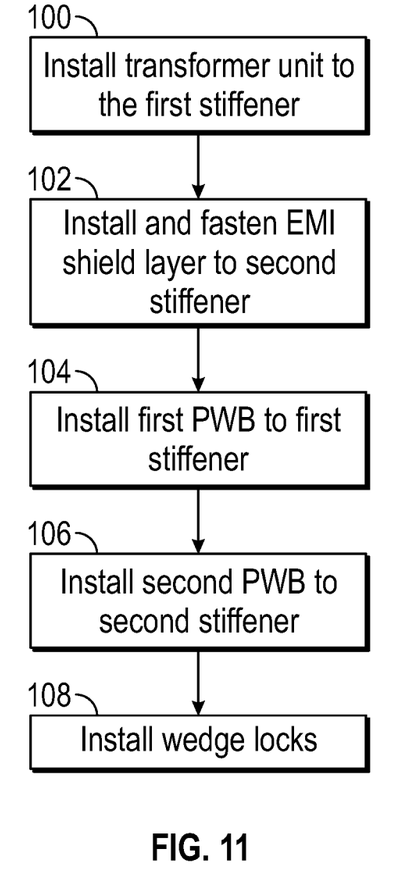
FIG. 11 is a schematic illustration of an assembly sequence of an electronic component assembly module.

Referring now to FIG. 11, a schematic illustration of an assembly sequence of an assembly module 10 is illustrated. At block 100, the completed transformer unit 24 is installed to the first stiffener 18. At block 102, the EMI shield layer 80 is installed and fastened on the second stiffener 20. At block 104, the first PWB 12 is installed to the first stiffener 18 with the adhesive film 22. At block 106, the second PWB 14 is installed to the second stiffener 20 with the adhesive film 22. Finally, at block 108, the wedge locks 58 are installed at the plate rail 56 and a stiffener rail 90 (shown in FIG. 13 and FIG. 14) of the first stiffener 18. The assembly sequence illustrated and described herein, however, is merely exemplary, and one skilled in the art will readily appreciate that other sequences may be utilized to assembly the assembly module 10.

Figure 12:
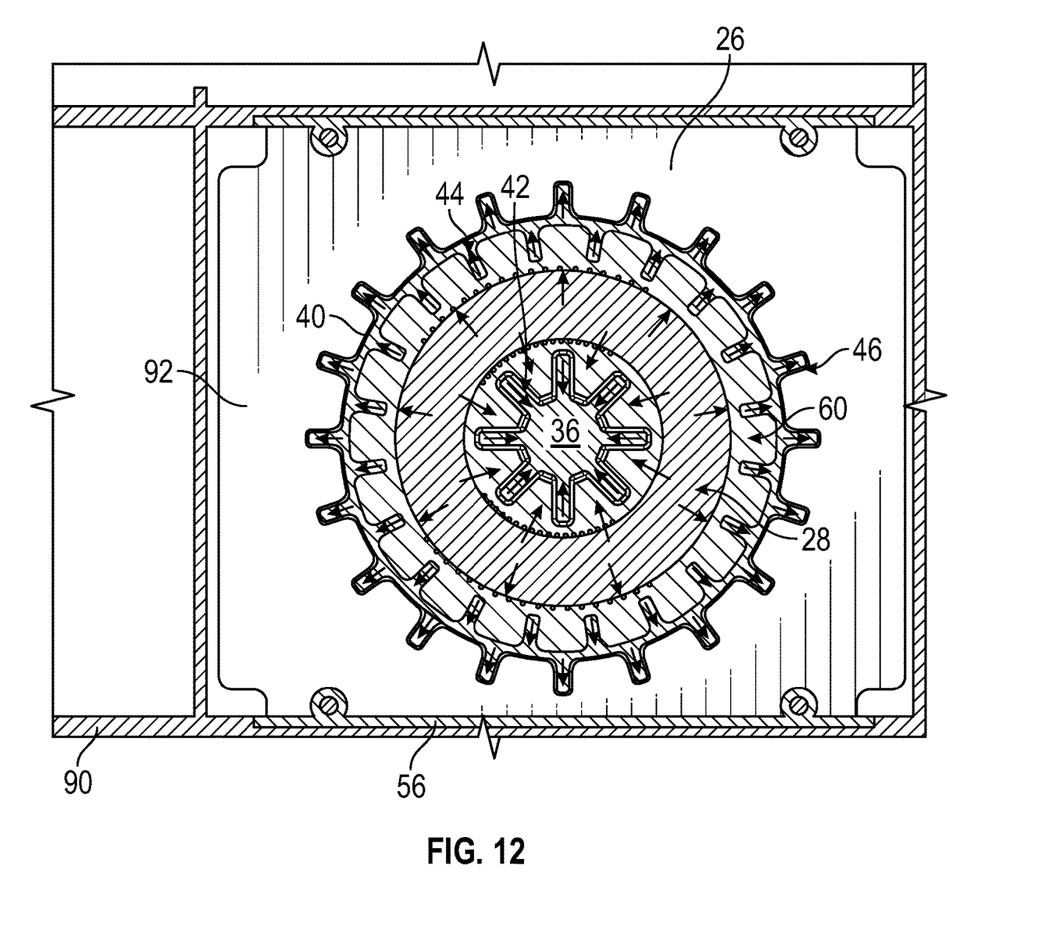
FIG. 12 is a first illustration of thermal energy conduction from a toroidal transformer.
Figure 13:
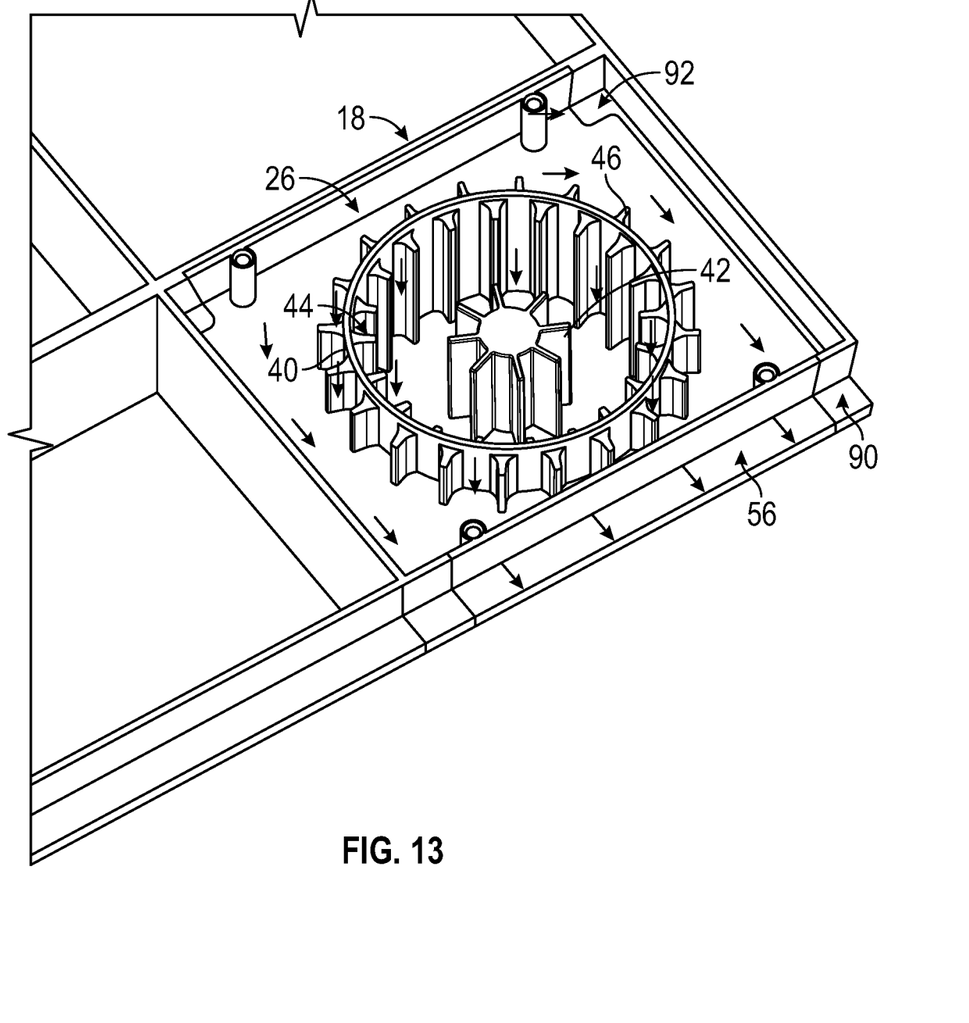
FIG. 13 is a second illustration of thermal energy conduction from a toroidal transformer.
Figure 14:
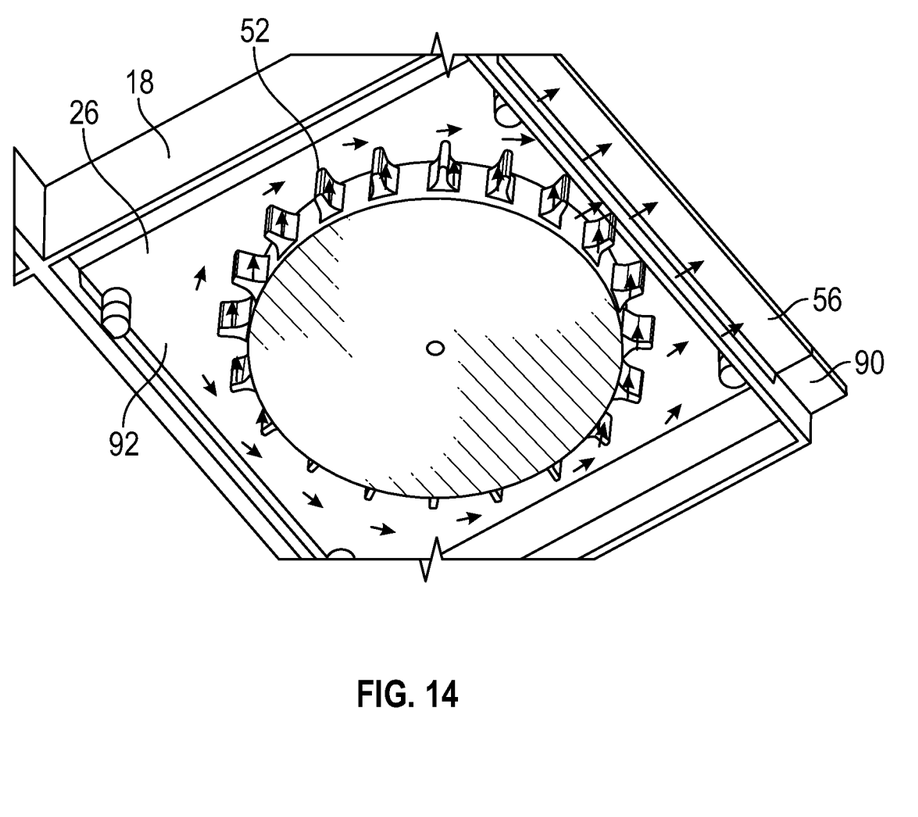
FIG. 14 is a third illustration of thermal energy conduction from a toroidal transformer.

Referring now to FIGS. 12-14, heat transfer from the toroidal transformer 28 is illustrated. As shown in FIG. 12, thermal energy from the toroidal transformer 28 transfers radially outward into the inner fins 44, from the inner fins 44 into the outer ring 40, and from the outer ring 40 into the outer fins 46. Further, thermal energy transfers radially inward from the toroidal transformer 28 into the center fins 42 and from the center fins 42 into the center boss 36. Referring now to FIG. 13, the thermal energy proceeds from the fins 42, 44, 46 into the base 92 and toward the plate rail 56 and into the stiffener rail 90. Both the plate rail 56 and the stiffener rail 90 are in contact with the heat sink (not shown in the figures). So, all the thermal energy would eventually flow into the heat sink through the plate rail 56 and the stiffener rail 90. Referring to FIG. 14, likewise thermal energy is transferred from the lower fins 52 into the base 92, and into the stiffener rail 90 via the plate rail 56.

In the disclosed embodiments, the toroidal transformer 28 has been mounted in the cavity of the transformer mounting plate 26, which is a metallic component separable from the first stiffener 18. The transformer mounting plate 26 includes fins 42, 44, 46, 52 to carry thermal energy away from the toroidal transformer 28, which then gets conducted to the stiffener rail 90. This allows for reduction in size of the toroidal transformer 28, and/or improving the reliability thereof.

The transformer mounting plate 26 provides multiple conductive heat transfer paths for heat dissipation from the toroidal transformer 28 transformer. This helps in maintaining the temperature of the toroidal transformer 28 below its maximum operating temperature, and includes features to improve ease of assembly and disassembly, for easy repair, replacement, or upgrade of the toroidal transformer 28. The transformer mounting plate 26, with the machined fins and cavity, is easy to manufacture using traditional machining techniques. The EMI gasket 72, installed between the first stiffener 18 and the transformer mounting plate 26, provides a low impedance path between the transformer mounting plate 26 and the first stiffener 18. It also facilitates an electrical bond between dissimilar metals. The EMI shield layer 80 is lossy (absorbent) to radio frequencies. It reduces the magnetic field induced in the printed wiring board 14. The two-PWB assembly configuration, such as shown in FIG. 1, also helps significantly in meeting the structural requirement in the vibration and shock environment.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A toroidal transformer assembly of an electronic component module assembly, comprising:
   a transformer mounting plate receptive of the toroidal transformer, the transformer mounting plate including:
      a base;
      a center boss extending from the base;
      an outer ring extending from the base, and spaced apart from the center boss, the center boss and the outer ring defining a mounting location for a toroidal transformer therebetween; and
      a plurality of fins to conduct thermal energy from the toroidal transformer to the base.

2. The toroidal transformer assembly of claim 1, further comprising a volume of potting material disposed in the mounting location, between the center boss and the outer ring.

3. The toroidal transformer assembly of claim 2, wherein the volume of potting material substantially covers the toroidal transformer.

4. The toroidal transformer assembly of claim 1, wherein a plurality of center fins extend radially outwardly from the center boss; and a plurality of inner fins extend radially inwardly from the outer ring.

5. The toroidal transformer assembly of claim 1, wherein the toroidal transformer includes:
   a toroidal core; and
   one or more conductive windings wrapped around the core.

6. The toroidal transformer of claim 1, wherein a plurality of outer fins extend radially outwardly from the outer ring.

7. An electrical component module assembly, comprising:
   a printed wiring board;
   a first stiffener affixed to the printed wiring board; and
   a toroidal transformer assembly secured to the first stiffener, the toroidal transformer including:
      a toroidal transformer, including:
         a toroidal core; and
         one or more conductive windings wrapped around the core; and
      a transformer mounting plate receptive of the toroidal transformer, the transformer mounting plate including:
         a base;
         a center boss extending from the base;
         an outer ring extending from the base, and spaced apart from the center boss, the center boss and the outer ring defining a mounting location for the toroidal transformer therebetween; and
         a plurality of fins to conduct thermal energy from the toroidal transformer to the base, and into the first stiffener.

8. The electrical component module assembly of claim 7, further comprising a volume of potting material disposed in the mounting location, between the center boss and the outer ring.

9. The electrical component module assembly of claim 8, wherein the volume of potting material substantially covers the toroidal transformer.

10. The electrical component module assembly of claim 7, wherein a plurality of center fins extend radially outwardly from the center boss.

11. The electrical component module assembly of claim 7, wherein a plurality of inner fins extend radially inwardly from the outer ring.

12. The electrical component module assembly of claim 7, wherein a plurality of outer fins extend radially outwardly from the outer ring.

13. The electrical component module assembly of claim 7, wherein the thermal energy is conducted into wedge lock mounting rail of the first stiffener.

14. The electrical component module assembly of claim 7, further comprising an electromagnetic interference gasket disposed between the transformer mounting plate and the first stiffener.

15. The electrical component module assembly of claim 7, further comprising a second stiffener assembled to the first stiffener.

16. The electrical component module assembly of claim 15, further comprising a second printed wiring board secured to the second stiffener opposite the first stiffener.

17. The electrical component module assembly of claim 15 further comprising an electromagnetic interference shield layer secured to the second stiffener over the toroidal transformer.

18. The electrical component module assembly of 15, further comprising a stiffener ring extending from the second stiffener toward the transformer mounting plate configured to locate the second stiffener relative to the toroidal transformer assembly.

19. The electrical component module assembly of claim 15, further comprising one or more wedge locks to secure the toroidal transformer assembly to the first stiffener.

20. The electrical component module assembly of claim 15, wherein the printed wiring board is permanently bonded to the first stiffener.

\* \* \* \* \*